United States Patent [19]
Kilian et al.

[11] Patent Number: 5,159,532
[45] Date of Patent: Oct. 27, 1992

[54] ELECTRONIC CONTROL UNIT WITH MULTIPLE HYBRID CIRCUIT ASSEMBLIES INTEGRATED ON A SINGLE COMMON CERAMIC CARRIER

[75] Inventors: Hermann Kilian, Diespeck; Günter Leicht, Stegaurach; Linhard Niemetz, Rednitzhembach, all of Fed. Rep. of Germany

[73] Assignee: TELEFUNKEN electronic GmbH, Heilbronn, Fed. Rep. of Germany

[21] Appl. No.: 707,198

[22] Filed: May 28, 1991

Related U.S. Application Data

[63] Continuation of Ser. No. 433,986, Nov. 9, 1989, abandoned.

Foreign Application Priority Data

Nov. 9, 1988 [DE] Fed. Rep. of Germany ....... 3837975

[51] Int. Cl.$^5$ ............................................. H05K 7/20
[52] U.S. Cl. .................. 361/388; 123/41.31; 123/647; 165/80.2; 361/395
[58] Field of Search ............... 363/141; 174/16.3, 252; 357/81; 361/381, 382, 386-388, 400, 399, 395; 165/80.2, 80.3; 123/647, 41.3

[56] References Cited

U.S. PATENT DOCUMENTS

| | | |
|---|---|---|
| 3,710,193 | 1/1973 | Greenberg et al. |
| 4,047,242 | 9/1977 | Jakob .................. 361/388 |
| 4,310,792 | 1/1982 | Iwatani ................ 307/303 |
| 4,557,225 | 12/1985 | Sagues ............... 123/41.31 |
| 4,605,986 | 8/1986 | Bentz ................... 361/386 |
| 4,646,203 | 2/1987 | Ngo ...................... 174/16.3 |
| 4,731,693 | 3/1988 | Berg ..................... 174/16.3 |
| 4,763,224 | 8/1988 | Bentz ................... 165/80.3 |
| 4,766,520 | 8/1988 | Huber et al. |
| 4,845,590 | 7/1989 | Mikolajczak ......... 361/388 |
| 4,893,590 | 1/1990 | Kashimura ........... 123/41.31 |
| 4,899,256 | 2/1990 | Sway-Tin ............. 361/386 |

FOREIGN PATENT DOCUMENTS

| | | |
|---|---|---|
| 2150695 | 4/1973 | Fed. Rep. of Germany |
| 7822999 | 1/1980 | Fed. Rep. of Germany |
| 8317699 | 11/1984 | Fed. Rep. of Germany |
| 3604074 | 8/1987 | Fed. Rep. of Germany |
| 8623251 | 2/1988 | Fed. Rep. of Germany |
| 8715073 | 4/1988 | Fed. Rep. of Germany |
| 1476886 | 6/1977 | United Kingdom |

OTHER PUBLICATIONS

DE-2: Bosch Technische Unterrichtung: "Batteriezündung" S. 15, 13,18,22.
DE-2: Graves, P. W. Dickschichttechnik-Werkstoffe und Zuverlässigkeit, Elektrisches Nachrichtenusen, Bd. 57, Nr. 2, 1982, S. 127-130.

*Primary Examiner*—Gerald P. Tolin
*Attorney, Agent, or Firm*—Spencer, Frank & Schneider

[57] ABSTRACT

The object of the patent application is an electronic control unit with triggering and power components, in particular an ignition control unit, whose electronic circuit comprises various assemblies in hybrid technology. To reduce the assembly expenditure and costs for manufacture, while at the same time reducing the volume, the invention provides for the assemblies of the electronic circuit to be integrated in a hybrid circuit and arranged on a single common carrier element. This carrier element is designed as an electrically non-conductive ceramic carrier of $Al_2O_3$, by which the electronic circuit of the control unit is electrically insulated from a heat sink.

3 Claims, 1 Drawing Sheet

ELECTRONIC CONTROL UNIT WITH MULTIPLE HYBRID CIRCUIT ASSEMBLIES INTEGRATED ON A SINGLE COMMON CERAMIC CARRIER

This application is a continuation of application Ser. No. 07/433,986, Filed Nov. 9th, 1989, now abandoned.

BACKGROUND OF THE INVENTION

The invention relates to an electronic control unit with triggering and power components, in particular an ignition control unit, whose circuit includes various subassemblies formed in hybrid technique.

Electronic ignition circuits, for example for automotive applications, consist of various parts or subassemblies, which are each assembled on a reseptive ceramic carrier as a hybrid circuit. A control unit, a switching element and an RC combination are usually required for this application.

The control unit, which serves to trigger and control the switching element, is built up on a ceramic substrate with printed conductor lines and resistors, by use of components in SMD- and chip form. The switching element represents the circuit breaker that switches the ignition coil current on and off in ignition control units. It comprises, for example, a power transistor chip soldered onto a metallic heat spreader used to improve the removal of dissipated power.

The RC combination contains a ceramic high-voltage capacitor and a power resistor. In ignition control units these components are either installed discretely in the plastic frame of the housing, or are mounted on a separate ceramic substrate which contains a printed power resistor and a high-voltage capacitor.

The dissipated power of the control unit is small compared with the power dissipation of the switching element. The dissipated power has to be removed to a heat sink.

For the electrical insulation of the control unit and of the switching element to heat sink, both of them are built up on a metallized ceramic substrate and mounted singly onto the heat sink. The electrical connection of the components to each other is made by Al-wire bonds.

An ignition control unit whose circuit components are deposited on an AlN ceramic carrier is known from German patent DE-PS 36 04 074.

However, the AlN ceramic carrier material is very expensive; in addition, the mechanically stabilizing heat sink is not present, so that the system is prone to breakage when fitted in the vehicle.

SUMMARY OF THE INVENTION

The object underlying the invention is to reduce the assembly expenditure and costs for manufacture of electronic control units, in particular of ignition control units, while at the same time reducing their volume. This is achieved in accordance with the invention by the components of the electronic circuit being integrated in a hybrid circuit and arranged on a single common carrier element.

Advantageous embodiments of the invention are given in the subclaims.

The electrical connection between the various assemblies and components of the electronic circuit has already been made within the common substrate, so that the additional wiring is reduced and assembly space between the individual circuit components is no longer needed. This leads to a high packing density, in conjunction with a lower space requirement.

Instead of testing the individual components, a joint function alignment or check of all circuit components can be made on the finished circuit.

Since the interconnections are dispensed with, and only a single unit must be mounted on the heat sink, inexpensive final assembly is also possible.

It is an advantage to use an inexpensive $Al_2O_3$ ceramic carrier instead of an expensive and thick AlN ceramic carrier. Mounting this thin ceramic insulator on a mechanically stable aluminum heat sink presents no danger of damage to the control unit during final assembly.

BRIEF DESCRIPTION OF THE DRAWINGS

The structure and the manufacture of an electronic control unit according to the invention is described in the following on the basis of an ignition control unit.

DESCRIPTION OF THE PREFERRED EMBODIMENTS

Figure 1:
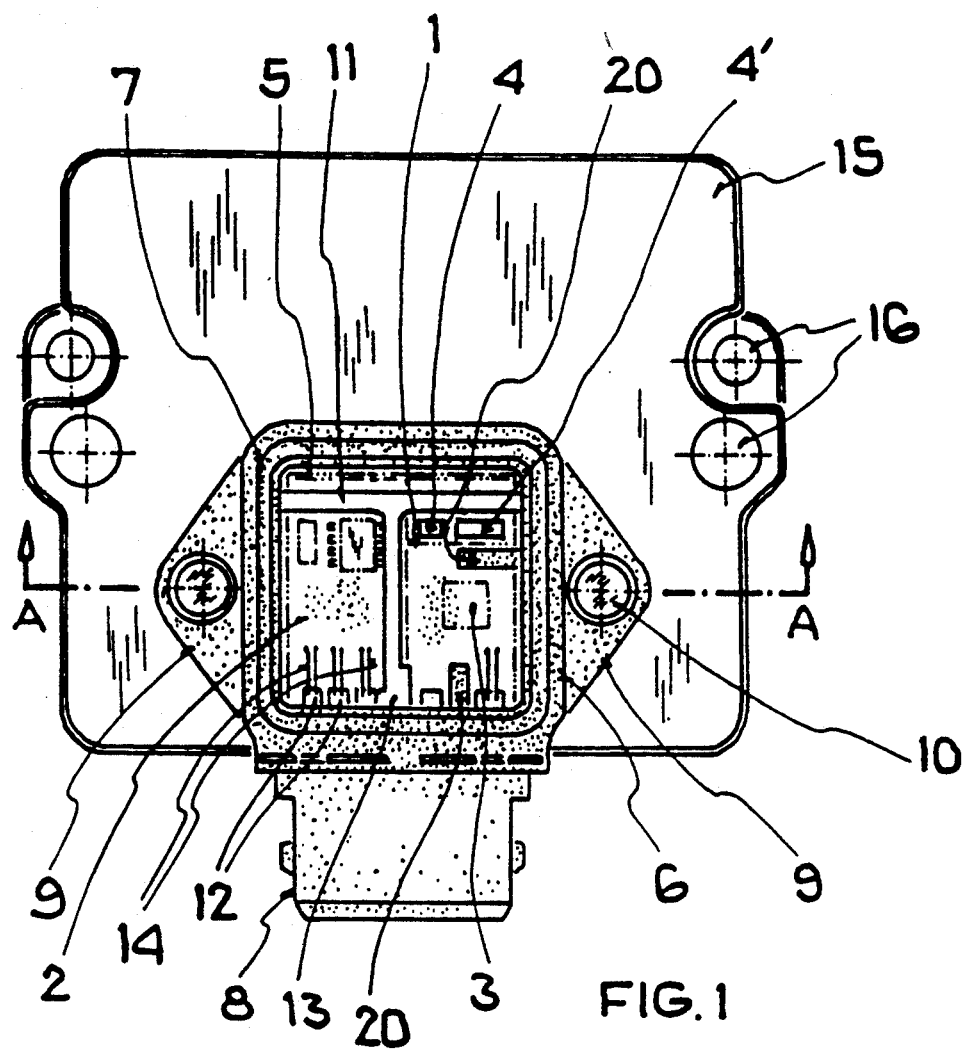
FIG. 1 shows a plan view of the structure of an ignition control unit.
Figure 2:
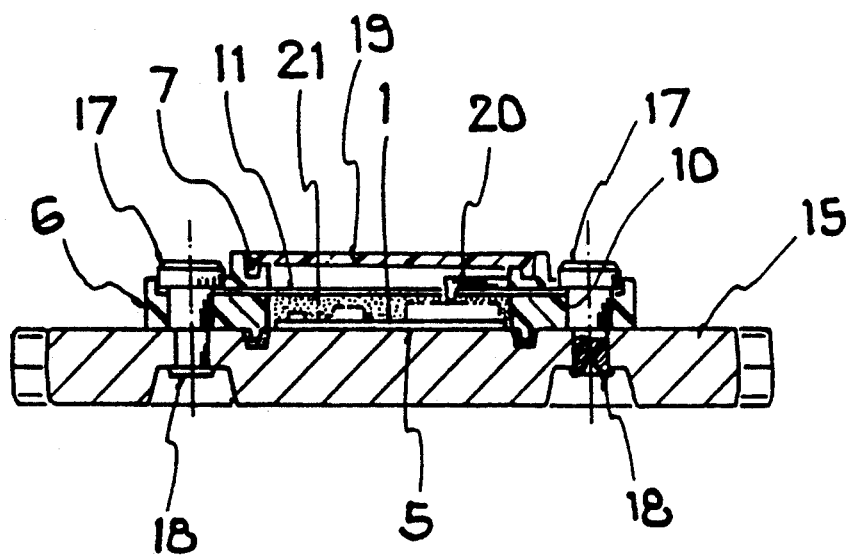
FIG. 2 shows the ignition control unit in a section along the line A—A in FIG. 1.

According to FIG. 1 and 2, the ignition control unit contains a heat sink 15, a housing element 6 with plastic frame 7, a plug terminal jack 8 and cover 19, plus an electronic ignition circuit 1.

All assemblies of the electronic ignition circuit 1, the control section 2, the power pack 3 and the RC combination including a capacitor 4 and a register 4', are jointly provided on the ceramic carrier element 5 used for electrical insulation of the electronic circuit unit 1 from the heat sink 15.

A metal board 11 whose plug terminals 12, 13 are connected to the electronic circuit 1 via bonded wires 14 is integrated in the plastic housing element 6. The metal board 11 is therefore used for contacting the electronic circuit 1 and provides an external connection option for the ignition control unit via the plug terminal jack 8.

The holes 10 in the flange-shaped part 9 of the plastic frame 7 are used for fastening the frame 7 to the heat sink 15. The holes 16 in the heat sink 15 are used for mounting the ignition control unit on a plate in the engine compartment of the vehicle.

The electronic circuit 1 is pressed in a defined manner against the heat sink 15 during assembly using the pressure elements 20 integrated in the housing frame 7.

The manufacturing and assembly method of the ignition control unit is described in the following.

The circuit board for holding the electronic components of the ignition circuit comprises a ceramic carrier element 5, preferably of $Al_2O_3$ provided with conducting paths and resistors in thick-film technology. Components in SMD and chip form, for example ICs and capacitors, and the transistor chip already soldered onto a heat spreader, are placed on the conducting paths provided with solder paste and connected both to the circuit board and to one another in a joint soldering operation.

The terminals of the other semiconductor elements are now provided with contacts using bonded wires on the conducting paths of the ceramic carrier element 5. The hybrid circuit 1 is now electrically operative, so that a necessary function alignment or check can be made on the already complete electronic circuit.

To form the housing element 6 with frame 7 and plug terminal jack 8, a metal board 11 is enclosed with plastic by injection molding. The metal board 11 extends right into the plug terminal jack 8 and thus forms the contact terminals for an external plug connection of the ignition control unit.

The hybrid circuit 1 is now placed on a heat sink 15 coated with adhesive and pressed in a defined manner against the heat sink 15, while the adhesive is setting, by means of the housing frame 7 fastened to the heat sink 15 with the aid of rivets 17. This pressing operation is effected using the deformable pressure elements 20 which are integrated in the housing frame and exert pressure on the heat spreader of the transistor chip. This measure generates the thin and pore-free adhesive layer required between the ceramic carrier 5 and the heat sink 15, which is necessary for good heat dissipation from the ceramic carrier to the heat sink.

In final assembly, the housing terminals 12, 13 are connected by bonded wires 14 to the terminals on the electronic circuit 1, the circuit is then encapsulated using a soft sealing compound 21, and the housing frame 7 sealed with a cover 19.

The ignition control unit is now ready for installation in the vehicle: mounting is on a sheet metal plate on the engine compartment with the aid of the holes 16 in the heat sink.

The integration of various assemblies on a single common carrier element can be used not only in ignition control units, but in all control units with triggering and power components that have various assemblies in hybrid technology.

What is claimed is:

1. An electronic control unit comprising:
    a housing including (a) a heat sink which forms a base of said housing and which is provided with mounting holes for mounting said unit on a support structure, (b) a closed frame member directly disposed on and fastened to a surface of said heat sink to define a cavity closed at one end with a surrounded portion of said surface of said heat sink, and (c) a separate cover on said frame member closing the other end of said cavity; and
    a single hybrid integrated electronic circuit including switching and power components, arranged in a plurality of separate assemblies with differing power dissipations, disposed on a surface of a single common electrically non-conductive carrier consisting of $Al_2O_3$, with said carrier being mounted directly on said surrounded portion of said surface of said heat sink within said cavity.

2. An electronic control unit according to claim 1 wherein said carrier is mounted on and fastened to said surface of said heat sink by an adhesive.

3. An electronic control unit according to claim 1 wherein said circuit is an electronic ignition circuit which contains, as said assemblies, a control section, a switching element and an RC combination, which are arranged on said surface of said common carrier, which surface is provided with conducting paths and resistors.

* * * * *